(12) United States Patent
Duineveld et al.

(10) Patent No.: US 6,787,987 B2
(45) Date of Patent: Sep. 7, 2004

(54) ELECTROLUMINESCENT COLOR DISPLAY PANEL

(75) Inventors: Paulus Cornelis Duineveld, Eindhoven (NL); Pieter Jacob Snijder, Eindhoven (NL); Coen Theodorus Hubertus Fransiscus Liedenbaum, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 191 days.

(21) Appl. No.: 10/023,401

(22) Filed: Dec. 13, 2001

(65) Prior Publication Data
US 2002/0109457 A1 Aug. 15, 2002

(30) Foreign Application Priority Data
Dec. 20, 2000 (EP) .............................. 00204644

(51) Int. Cl.⁷ .............................. H01J 1/62; H01J 63/04
(52) U.S. Cl. ....................................................... 313/500
(58) Field of Search ................................. 313/582–587, 313/495, 500

(56) References Cited

U.S. PATENT DOCUMENTS

| 5,965,983 | A | * | 10/1999 | Bouwkamp-Wijnoltz et al. | 313/635 |
| 6,008,578 | A | * | 12/1999 | Chen | 313/506 |
| 6,278,238 | B1 | * | 8/2001 | Hong | 313/584 |
| 6,361,390 | B1 | * | 3/2002 | Sreeram et al. | 445/24 |

FOREIGN PATENT DOCUMENTS

EP 0767599 4/1997 .......... H05B/33/12

* cited by examiner

Primary Examiner—Vip Patel
Assistant Examiner—Sumati Krishnan

(57) ABSTRACT

The positional arrangement of the color section in each pixel of an electroluminescent display panel is different from the positional arrangement of the color sections in at least one adjacent pixel. This yields an improved image quality as perceived by the viewer, in particular when moving images are displayed on low-resolution displays. A preferred embodiment of the invention is an electroluminescent display panel in which the color sections are arranged on continuous lines, which are oriented to run diagonally across the display panel.

17 Claims, 5 Drawing Sheets

ELECTROLUMINESCENT COLOR DISPLAY PANEL

The invention relates to an electroluminescent color display panel comprising a plurality of pixels arranged in rows and columns to form a grid pattern, each pixel comprising at least two color sections, a first color section of which emits light of a first color, and a second color section, emits light of a second color being different from the first color.

The invention also relates to a method of manufacturing an electroluminescent color display panel, and to an electronic device comprising the electroluminescent color display.

Electroluminescent display panels, comprising a plurality of organic electroluminescent devices are known. An electroluminescent device is a device, which, while making use of the phenomenon of electroluminescence, emits light when the device is suitably connected to a power supply. The term electroluminescence includes several phenomena which have the common feature that light is emitted by an electric discharge in gases, liquids and solid materials. Generally, an electroluminescent device comprises one or more layers made of an electroluminescent material disposed between a cathode and an anode. Electroluminescent display panels are also known, wherein numerous light-emitting devices are formed on a single substrate, arranged in groups in a regular grid pattern, each group forming a picture element, also referred to as pixel. Several light-emitting devices forming a column of the grid may share a common first electrode, i.e. a common anode, also referred to as anode line. Several light-emitting devices forming a row of the grid may share a common second electrode, i.e. a common cathode, also referred to as cathode line. The individual light-emitting devices in a given group emit light when their associated cathode line and anode line are activated at the same time. Activation may be by rows and columns or, as in an active matrix, with individual anode pads.

Figure 1:
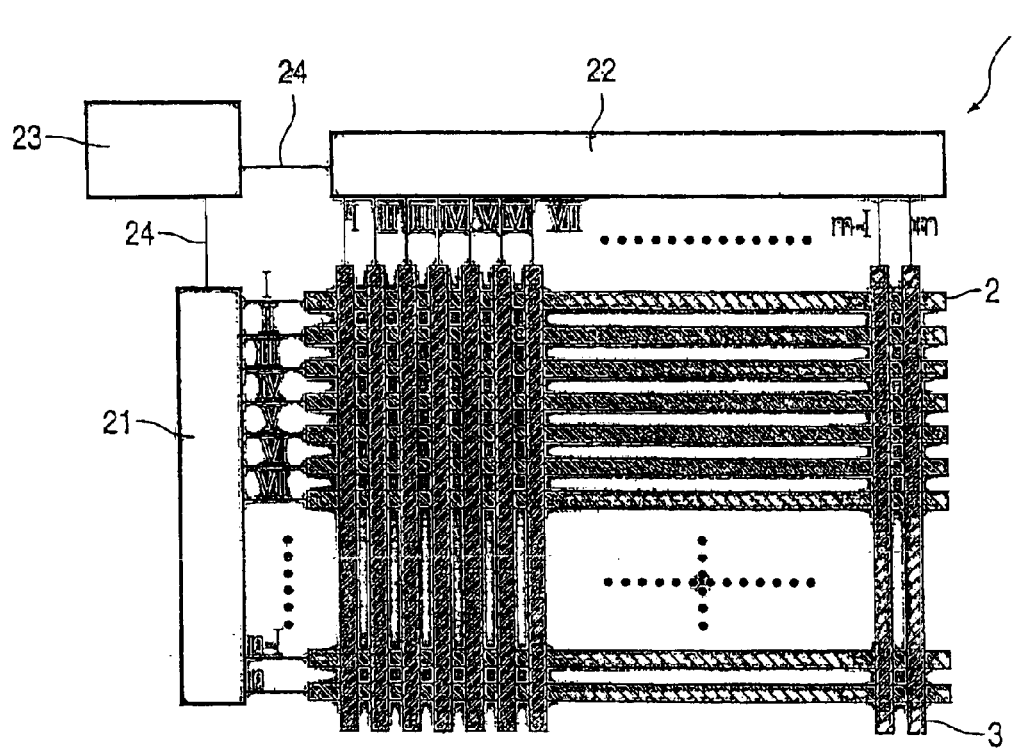

European patent application EP 0 767 599 discloses a 3 color organic electroluminescent display device comprising a matrix of the electroluminescent elements (herein also referred to as pixels). Each pixel in the matrix has one or more emitting devices for red, green and blue in order to display a color image, each emitting device being associated with an intersection of a column and a row of matrix electrodes. As shown in FIG. 1 of EP 0 767 599, the emitting devices for red are arranged on a column, or vertical line. In the same manner, the emitting devices for green and blue are arranged on vertical lines. A pixel comprises emitting devices of three vertical lines. This pixel layout is further referred to as 'V-line'. Alternatively, it is possible to form a pixel pattern with a delta arrangement of red, green and blue in the display panel and also draw a bent or meandered cathode pattern on the display panel.

A disadvantage of the prior-art electroluminescent color display is that it provides a low image quality, in particular when moving images are displayed on low-resolution displays.

It is an object of the present invention to provide an electroluminescent color display panel having a perceptibly improved image quality.

To this end, a first aspect of the invention provides an electroluminescent color display panel as defined in claim 1. A second aspect of the invention provides a method of manufacturing an electroluminescent display panel as defined in claim 9. A third aspect of the invention provides an electronic device as defined in claim 13. Advantageous embodiments are defined in the dependent claims.

In accordance with the first aspect of the invention, the positional arrangement of the first and second color sections within a first pixel is different from the positional arrangement of the first and second color sections within a second pixel, wherein the first pixel is adjacent to the second pixel.

The different positional arrangement of the first and second color sections within two adjacent pixels disrupts pure grid-correlated patterns in the image, which patterns may arise from the arrangement of the pixels in a grid. This disruption of the grid-correlated patterns improves the perceived image quality. The adjacent pixels of a first pixel may comprise horizontally, vertically or diagonally neighboring pixels of the first pixel.

In color displays, the chosen arrangement of the color sections within a pixel determines the quality of the perceived image to a large extent. In the prior-art electroluminescent color display panels, the arrangement of the color sections within a pixel is the same for each pixel. Moreover, characteristic of this type of color display panel is that the pixels are usually arranged in a grid pattern comprising vertical columns and horizontal rows. The purely horizontally and/or vertically oriented pixel structures, with the same arrangement of the color sections within the pixels, clearly show a lower image quality, especially on low-resolution displays, because the human eye has a tendency to focus on correlated patterns originating from the pixel layout, which do not belong to the actual image. In the electroluminescent color display panel according to the invention, the pixels are still arranged in a grid pattern comprising vertical columns and horizontal rows. However, purely horizontally and/or vertically correlated patterns are disrupted because two adjacent pixels comprise a different arrangement of the color sections within the pixel.

An embodiment of the invention as defined in claim 2 is characterized in that two adjacent pixels in a column comprise a different arrangement of the color sections within the pixel. The disruption of the vertically correlated patterns improves the perceived image quality, as will be illustrated in the Figures.

Naturally, an equivalent embodiment may comprise two adjacent pixels in a row, which comprise a different arrangement of the color sections within the pixel. The disruption of the horizontally correlated patterns improves the perceived image quality.

An embodiment of the invention as defined in claim 3 is particularly useful when a printing technique, such as inkjet printing, is used in the manufacture of the color sections. When the first color sections are adjacently arranged on a plurality of parallel, laterally spaced lines, such a line of color sections can be printed by moving the printing head or heads, along the line or lines (the latter, in the case where more than one line is printed simultaneously). It is preferred that also the other color sections, which, in operation, emit light of the same color, are adjacently arranged on a plurality of parallel, laterally spaced lines. Preferably, the laterally spaced lines of the various color sections are substantially parallel. Although the pattern of emissive material of this embodiment is still a line-wise correlated color pattern, this correlated pattern is subjectively less annoying than a pure vertical or horizontal one.

The first color sections are adjacently arranged, and there is a small distance between two printing positions. Thus, the traveling distance of the printing head between two printing positions is small. This yields an efficiency advantage in the production process, because the time in which the printing head travels between two printing positions and does not contribute to the printing process, is small.

The advantage mentioned in the previous paragraph is even more exploited by an embodiment as defined in claim 4. In accordance with an embodiment as defined in claim 4, the first color sections, which are arranged on one slanting line, form a continuous strip of electroluminescent material. When using a printing technique, such as inkjet printing, this embodiment allows printing of a continuous line of deposited electroluminescent material of a specific color. Of course it is possible to interrupt the deposition at the appropriate positions, but this introduces problems in the manufacturing process related to positioning of the printing head above the substrate at the desired locations. Furthermore, after activation of the printing head, initial instabilities in the droplet formation may occur, resulting in an undefined layer thickness of the deposited emissive material. These disadvantages are, at least partially, cancelled out by the embodiment of the invention as defined in claim 4.

For example, the emitting devices for a first color are arranged on a column, or vertical line. In the same manner, the emitting devices for the other colors are arranged on vertical lines. The various lines with emitting devices of a certain color alternate. A pixel comprises emitting devices of each color from neighboring vertical lines, so that the various color sections in a pixel are adjacently positioned in the row direction. Examples of such display panels are plasma display panels and organic LED display panels.

Plasma display panels consist of a back plate equipped with a plurality of parallel channels. The bottom and the sidewalls of the channels are coated with red, green and blue phosphors, while each channel usually comprises phosphors of one color. The column (address) electrodes are located on the bottom of the channels. The front plate is equipped with a plurality of parallel, laterally spaced row electrodes. A plasma display panel cell is located at the crossing of a row and a column electrode. The front plate and the back plate are sealed together and filled with gas. In operation, light is emitted by an electric discharge in the gas. In a plasma display panel according to the invention, the channels are arranged on a plurality of parallel, laterally spaced slanting lines with respect to the rectangular grid as defined by the row and column electrodes.

Passive matrix organic LED displays may consist of a transparent substrate which is provided with a plurality of parallel, laterally spaced (transparent) column electrodes. The organic LED displays further consist of a plurality of parallel, laterally spaced continuous lines of organic electroluminescent material of a specific color (i.e. red, green or blue). The lines of organic electroluminescent material are usually oriented parallel to the column electrodes. The row electrodes are positioned perpendicular to the column electrodes and on top of the organic electroluminescent material. In operation, the individual light-emitting devices of the organic LED display emit light when their row electrode and column electrode are activated at the same time. In the organic LED display panel according to the invention, the lines of organic electroluminescent material are arranged on a plurality of parallel, laterally spaced slanting lines with respect to the rectangular grid as defined by the row and column electrodes.

In an embodiment of the invention as defined in claim 5, the acute angle between a vertical column and the slanting lines is in a range of +10 and −10 degrees around a preferred angle α, and the preferred angle α is equal to:

$$\alpha = \arctan\left(\frac{P_r}{n \cdot P_c}\right)$$

wherein n is the number of color sections in a pixel, $P_r$ is the pitch of the pixels in the row direction, and $P_c$ is the pitch of the pixels in the column direction. It is preferred in this embodiment that the color sections in a pixel are positioned side by side in the row direction. When using this preferred angle, the color sections in the pixels in the same column are shifted in the row direction with respect to the color sections in a neighboring pixel. The extent of the shift is such that the layout of the color sections in a pixel of the $(n+1)^{st}$ row in a first column, counting from said first row, is equal to the layout of the color sections in a pixel of the first row in said first column.

This design rule is also applicable when the color sections in a pixel are positioned side by side in the column direction. In this case, the acute angle between a vertical column and the slanting lines is in a range of +10 and −10 degrees around a preferred angle β, and the preferred angle β is equal to:

$$\beta = \arctan\left(\frac{n \cdot P_c}{P_r}\right).$$

When using this preferred angle, the color sections in the pixels in the same row are shifted in the column direction with respect to the color sections in a neighboring pixel. The extent of the shift is such that the layout of the color sections in a pixel of the $(n+1)^{st}$ column in a first row, counting from said first column, is equal to the layout of the color sections in a pixel of the first column in said first row.

In accordance with a second aspect of the invention, a method of manufacturing an electroluminescent color display panel comprises the steps of:

forming a plurality of parallel, laterally spaced first electrode strips on a substrate, arranging a plurality of parallel, laterally spaced electroluminescent strips, each strip, in operation, emitting light of one of at least a first or a second color, which strips of different colors are positioned side by side, in a repeating pattern forming a plurality of parallel, laterally spaced second electrode strips, which second electrode strips cross the plurality of first electrode strips such that, in operation, an individual light-emitting device is allocated at the crossing of a first and a second electrode strip, and is characterized in that the electroluminescent strips, are arranged on a plurality of parallel, laterally spaced slanting lines with respect to a grid formed by the first and second electrode strips. The deposition of emissive material may be guided by a pattern of resist banks, oriented along the slanting lines. The emissive material is deposited between two resist banks. In this arrangement, printing may be effected occur in a continuous process, without the need of synchronized deposition. The resist banks prevent mixing of the printed electroluminescent material for different color sections.

In the case where the electroluminescent strips comprise an organic electroluminescent material, the organic electroluminescent material is preferably deposited, using an inkjet printer.

In accordance with a third aspect of the invention, an electronic device comprises an electroluminescent color display panel as defined in claim 1. The perceptibly improved image quality on low-resolution displays is especially advantageous in handheld or portable electronic devices such as, for example, mobile phones, personal organizers and calculators.

These and other aspects of the invention are apparent from and will be elucidated with reference to the embodiments described hereinafter.

Figure 2:
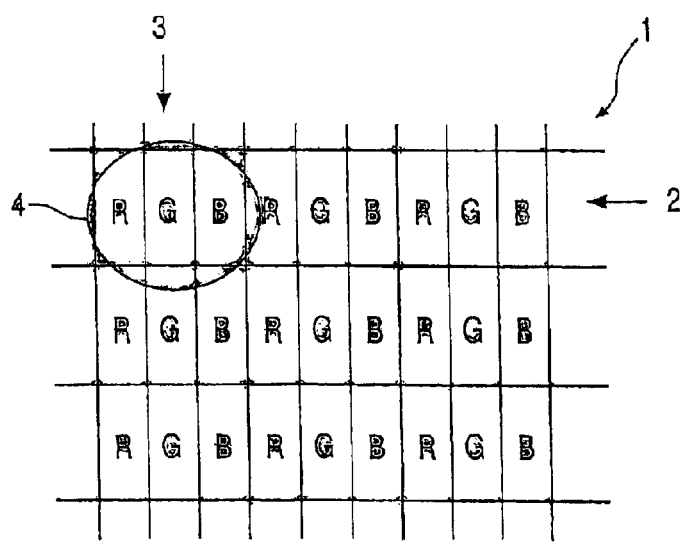
Figure 3:
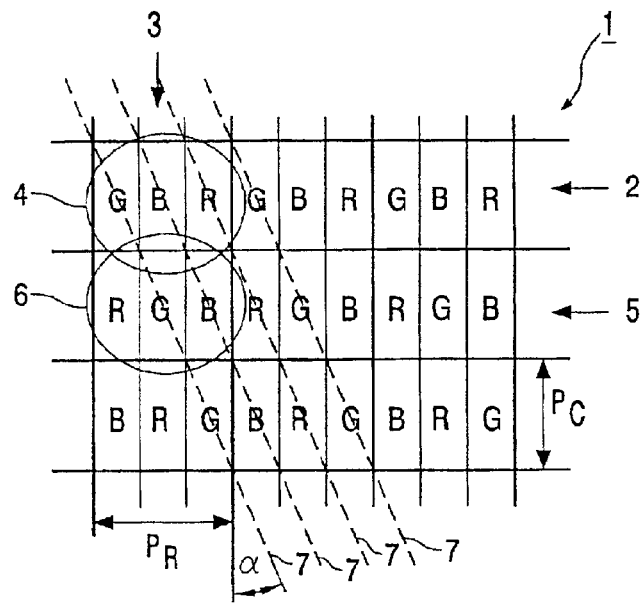
Figure 4:
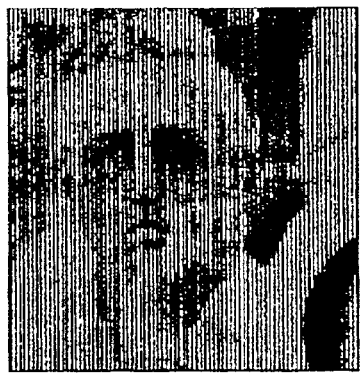
Figure 5:
Figure 6:
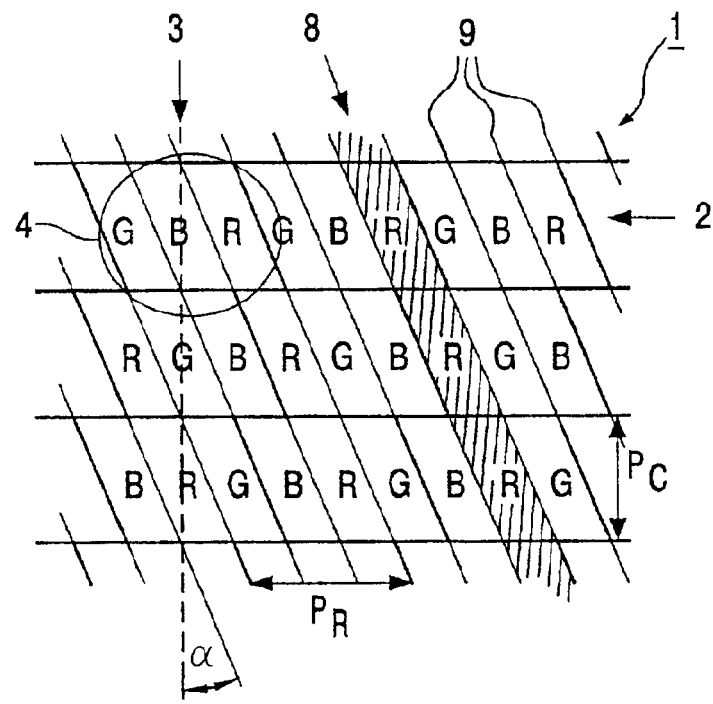
Figure 7:
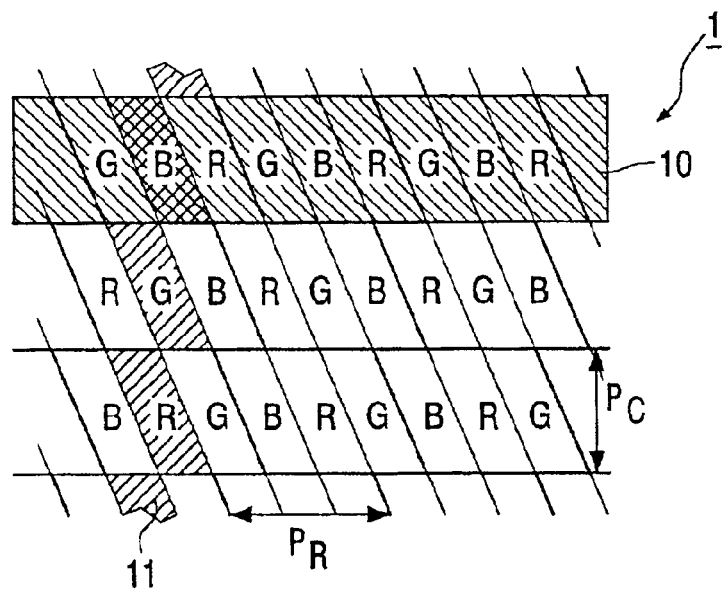
Figure 8:
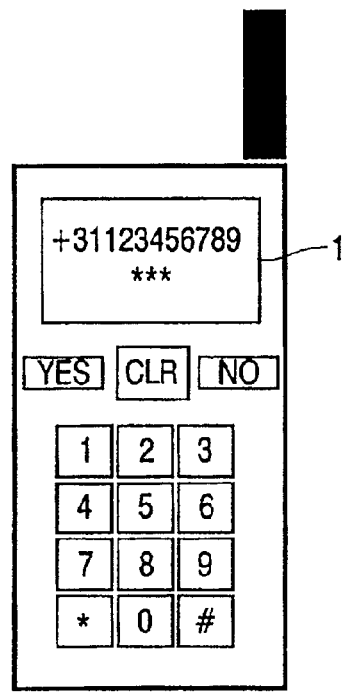
Figure 9:
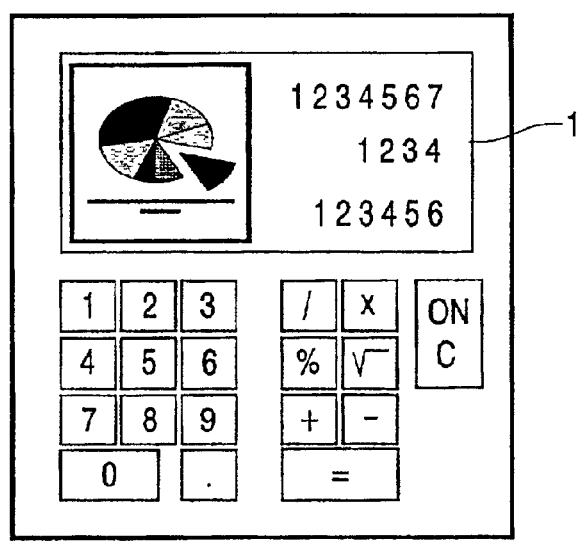
Figure 10:
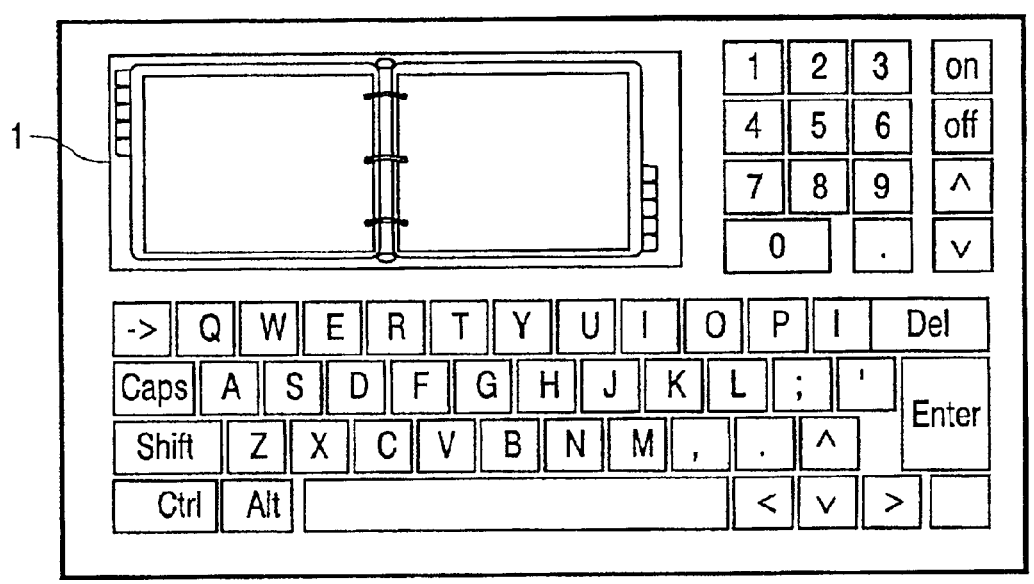

In the drawings:

FIG. 1 schematically shows an equivalent-circuit diagram of an electroluminescent display panel, FIG. 2 is a schematic view of a part of an electroluminescent display panel in accordance with the prior art, where a pixel contains emitting devices of three vertical lines (V-line pixel layout), FIG. 3 is a schematic view of a part of an electroluminescent display panel in accordance with the invention, where two adjacent pixels in a column comprise a different positional arrangement of the color sections within the pixel, FIG. 4 shows the result of a simulation of a picture as displayed on an electroluminescent display panel of the prior art, FIG. 5 shows the result of a simulation of a picture as displayed on an electroluminescent display panel in accordance with the invention, FIG. 6 is a schematic view of a part of another embodiment of the electroluminescent display panel in accordance with the invention, where the color sections of the plurality of pixels form a continuous color determining strip, which color sections, in operation, emit the same color and are arranged on one slanting line, FIG. 7 is a schematic view of the embodiment of FIG. 6, where a possible layout of a column and a row electrode is presented, and FIGS. 8 through 10 show examples of electronic devices comprising an electroluminescent color display panel as defined in claim 1.

FIG. 1 schematically shows an equivalent circuit diagram of a part of an electroluminescent color display panel 1 comprising a plurality of light emitting sections arranged in n rows 2 and m columns 3. Each intersection of a row 2 and a column 3 electrode forms a light-emitting section. This display panel further includes a row-selection circuit 21 (for example, a multiplex circuit) and a data register 22. Externally presented information, for example, a video signal is processed in a control unit 23 which, dependent upon the information to be displayed, loads the individual parts of the data register 22. Mutual synchronization between the selection of the rows and the presentation of voltages to the column electrodes takes place by means of the control unit 23 via control lines 24.

FIG. 2 is a schematic view of a part of an electroluminescent display panel 1 of the prior art. For the sake of clarity, this and subsequent drawings are not drawn to scale and some parts are drawn on a longer scale. The electroluminescent display panel 1 comprises a plurality of pixels 4 arranged in rows 2 and columns 3 to form a grid pattern, or a matrix. Each pixel 4 of this example comprises three color sections: a red R, a green G and a blue B color section which, in operation, may emit red, green or blue light, respectively. This pixel configuration is used in matrix-addressed electroluminescent display panels. A picture is scanned, for example, row by row at a time while applying the appropriate signals to the columns.

According to the invention, the positional arrangement of the color sections within each pixel is different from the positional arrangement of the color sections within at least one adjacent pixel. An embodiment of the electroluminescent display panel 1 in accordance with the invention is shown in FIG. 3. In this embodiment, the RGB color sections are shifted along the direction of the rows 2. In the pixel 4 at the crossing of column 3 and row 2, the color sections are arranged, from left to right, as green G, blue B and red R. In the pixel 6 at the crossing of column 3 and row 5, the color sections are arranged, from left to right, as red R, green G and blue B. Thus, two adjacent pixels 4, 6 in a column 3 comprise a different positional arrangement of the color sections within the pixel. Moreover, the color sections R, G or B of the plurality of pixels, which color sections, in operation, emit the same color, are adjacently arranged on a plurality of parallel, laterally spaced slanting lines 7 with respect to the grid pattern of the pixels. The acute angle between a vertical column 3 and a slanting line 7 is equal to angle α:

$$\alpha = \arctan\left(\frac{P_r}{n \cdot P_c}\right)$$

wherein n is the number of color sections in a pixel (in this example n=3: R, G and B), $P_r$ is the pitch of the pixels 4, 6 in the row 2, 5 direction, and $P_c$ is the pitch of the pixels 4, 6 in the column 3 direction. The pitch is the distance between the centers of two adjacent pixels 4, 6.

In conformity with the pixel configurations of FIGS. 2 and 3, FIGS. 4 and 5 show the result of a simulation which compares an electroluminescent display panel having a V-line pixel layout (as in FIG. 2) and an electroluminescent display panel having a pixel layout according to the invention (as in FIG. 3). Although the pixel layout of FIG. 3 still has a line-wise correlated RGB pattern (along lines 7), the perceived image quality of FIG. 5 is improved when compared with the image of FIG. 4.

In some electroluminescent displays panels 1, such as plasma display panels and organic LED display panels, the electroluminescent material is deposited by using printing techniques, such as inkjet printing. The use of inkjet printing for depositing the luminescent material in the color sections R, G or B is applied most successfully if a line 8 of deposited electroluminescent material of a specific color can be printed continuously. Of course, it is possible to interrupt the inkjet deposition at the appropriate positions, but this introduces problems in the manufacturing process related to the positioning of the inkjet orifice above the substrate at the desired location. Furthermore, after activation of the piezo in the printing head, initial instabilities in the droplet formation occur, resulting in an undefined layer thickness of the deposited emissive material. It is therefore proposed that the color sections are not printed along the columns 3, but oriented diagonally across the columns 3. A schematic view of an example of the proposed pixel layout is presented in FIG. 6. In this embodiment of the invention occur continuously along the line 8, without the need of position synchronized deposition. With this pixel layout, a triplet color section arrangement is obtained which, to some extent, resembles the pixel layout presented in FIG. 3, while circumventing the above mentioned issues related to operation of the inkjet printer.

The deposition of the electroluminescent material may be guided by a pattern of resist banks 9, which are oriented diagonally across the columns. The electroluminescent material is deposited between two resist banks 9, which prevent mixing of the materials, which would result in unwanted and undefined color mixing.

To address the color sections of the embodiment of FIG. 6, it is preferred to use row 10 and column 11 electrodes as depicted in FIG. 7. As the color sections of the embodiment of FIG. 6 will have a diamond like shape, the column electrodes 11 may have a stepped pattern as shown in FIG. 7.

The perceptibly improved image quality on low-resolution displays according to the invention is especially advantageous in handheld or portable electronic devices such as mobile phones, personal organizers and calculators. Examples of such electronic devices comprising an electroluminescent color display panel 1 as defined in claim 1 are depicted in FIGS. 8 through 10; FIG. 8 shows a mobile phone comprising an electroluminescent color display panel 1 according to the invention, FIG. 9 shows a calculator comprising an electroluminescent color display panel 1 according to the invention, and FIG. 10 shows a personal organizer comprising an electroluminescent color display panel 1 according to the invention.

In summary, the positional arrangement of the color section in each pixel of an electroluminescent display panel is different from the positional arrangement of the color sections in at least one adjacent pixel. This yields an improved image quality as perceived by the viewer, in particular when moving images are displayed on low-resolution displays. A preferred embodiment of the invention is an electroluminescent display panel in which the color sections are arranged on continuous lines, which are oriented to run diagonally across the display panel.

It should be noted that the above-mentioned embodiments illustrate rather than limit the invention, and that those skilled in the art will be able to design many alternative embodiments without departing from the scope of the appended claims. For example, the functionality of columns and rows may be transposed without departing from the invention.

The invention may also be applied in active matrix organic LED displays, where column and row electrodes are used for addressing a color section.

In the claims, any reference signs placed between parentheses shall not be construed as limiting the claim. Use of the verb "to comprise" and its conjugations does not exclude the presence of elements or steps other than those stated in a claim.

What is claimed is:

1. An electroluminescent color display panel comprising a plurality of pixels arranged in rows and columns to form a grid pattern, each pixel comprising at least two color sections, a first color section of which emits light of a first color, and a second color section emits light of a second color being different from the first color, wherein the positional arrangement of the first and second color sections within a first one of the pixels, further referred to as the first pixel, is different from the positional arrangement of the first and second color sections within a second one of the pixels, further referred to as the second pixel, wherein the first pixel is adjacent to the second pixel, wherein the first color sections are adjacently arranged on parallel, laterally spaced apart, slanting lines with respect to the column direction, and wherein the acute angle between a vertical column and the slanting lines is in a range of +10 and −10 degrees around a preferred angle α, and the preferred angle α is equal to:

$$\alpha = \arctan\left(\frac{P_r}{nP_c}\right)$$

wherein n is the number of color sections in a pixel, Pr is the pitch of the pixels in the row direction, and Pc is the pitch of the pixels in the column direction.

2. An electroluminescent color display panel as claimed in claim 1, wherein the first pixel and the second pixel are arranged in the same column.

3. The electroluminescent color display panel of claim 2, wherein a color section comprises a layer of a phosphor material which is excited by a plasma discharge.

4. The electroluminescent color display panel of claim 2, wherein a color section comprises a layer of an organic electroluminescent material.

5. An electroluminescent color display panel as claimed in claim 1, wherein the first color sections, which are arranged on one slanting line, form a continuous strip of electroluminescent material.

6. The electroluminescent color display panel of claim 5, wherein a color section comprises a layer of a phosphor material which is excited by a plasma discharge.

7. The electroluminescent color display panel of claim 5, wherein a color section comprises a layer of an organic electroluminescent material.

8. An electroluminescent color display panel as claimed in claim 1, wherein a color section comprises a layer of an organic electroluminescent material.

9. An electroluminescent color display panel as claimed in claim 8, wherein the organic electroluminescent material is a polymer.

10. An electroluminescent color display panel as claimed in claim 1, wherein a color section comprises a layer of a phosphor material which is excited by a plasma discharge.

11. An electronic device comprising an electroluminescent color display panel as claimed in claim 1.

12. A method of manufacturing an electroluminescent color display panel, said method comprising:

forming a plurality of parallel, laterally spaced first electrode strips on a substrate, arranging a plurality of parallel, laterally spaced electroluminescent strips, each strip, in operation, emitting light of one of at least a first or a second color, wherein strips of different colors are positioned side by side, in a repeating pattern, and forming a plurality of parallel, laterally spaced second electrode strips, which second electrode strips cross the plurality of first electrode strips such that, in operation, an individual light-emitting device is allocated at the crossing of a first and a second electrode strip, wherein the electroluminescent strips are arranged on a plurality of parallel, laterally spaced slanting lines with respect to a grid formed by the first and second electrode strips; and wherein the acute angle between the first or the second electrode strip and a slanting line is in a range of +10 and −10 degrees around a preferred angle α, and the preferred angle α is equal to:

$$\alpha = \arctan\left(\frac{P_r}{nP_c}\right)$$

wherein n is the number of color sections in a pixel, $P_r$ is the pitch of the pixels in the row direction, and $P_c$ is the pitch of the pixels in the column direction.

13. A method as claimed in claim 12, wherein the second electrode strips cross the first electrode strips substantially perpendicularly, which yields a substantially rectangular gild formed by the first and second electrode strips.

14. The method of claim 13, wherein the electroluminescent strips comprise an organic electroluminescent material, which organic electroluminescent materiel is deposited by using an inkjet printer.

15. A method as claimed in claim 12, wherein the electroluminescent strips comprise an organic electroluminescent material, which organic electroluminescent material is deposited by using an inkjet printer.

16. An electroluminescent color display panel comprising:

a plurality of parallel, laterally spaced row electrodes;

a plurality of parallel, laterally spaced electroluminescent strips, each strip, in operation, emitting light of one of at least a first or a second color, wherein strips of different colors are positioned side by side, in a repeating pattern; and a plurality of parallel, laterally spaced column electrodes, said column electrodes crossing the plurality of row electrodes such that, in operation, an individual light-emitting device is allocated at the crossing of a row and a column electrode, wherein the electroluminescent strips are arranged on a plurality of parallel, laterally spaced slanting lines with respect to a grid formed by the row and column electrodes, and wherein each of the column electrodes has a stepped pattern such that no straight line extends along a border of the column electrode from a top to a bottom thereof.

17. The electroluminescent color display panel of claim 16, wherein the electroluminescent strips each comprise an organic electroluminescent material, which organic electroluminescent material is deposited by using an inkjet printer.

\* \* \* \* \*